United States Patent
Yeh

(10) Patent No.: US 9,773,565 B1
(45) Date of Patent: Sep. 26, 2017

(54) MEMORY RETRY-READ METHOD, MEMORY STORAGE DEVICE AND MEMORY CONTROL CIRCUIT UNIT

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

(*) Notice: Subject to any disclaimer, the term of this patent is extended or adjusted under 35 U.S.C. 154(b) by 0 days.

(21) Appl. No.: 15/458,037

(22) Filed: Mar. 14, 2017

(30) Foreign Application Priority Data

Jan. 19, 2017 (TW) .............................. 106101855 A

(51) Int. Cl.
| | |
|---|---|
| *G11C 16/06* | (2006.01) |
| *G11C 16/26* | (2006.01) |
| *G06F 11/10* | (2006.01) |
| *G11C 29/52* | (2006.01) |
| *G11C 16/32* | (2006.01) |

(52) U.S. Cl.
CPC .......... *G11C 16/26* (2013.01); *G06F 11/1068* (2013.01); *G11C 16/32* (2013.01); *G11C 29/52* (2013.01)

(58) Field of Classification Search
CPC ................................. G11C 16/06; G11C 16/26
USPC ........................................ 365/185.01–185.33
See application file for complete search history.

(56) References Cited

U.S. PATENT DOCUMENTS

| | | | | |
|---|---|---|---|---|
| 2008/0106941 | A1* | 5/2008 | Cho ........................ | G11C 16/12 365/185.13 |
| 2009/0129146 | A1* | 5/2009 | Sarin ................... | G11C 16/3418 365/185.02 |
| 2009/0185425 | A1* | 7/2009 | Ravasio ................. | B82Y 10/00 365/185.18 |
| 2011/0058413 | A1* | 3/2011 | Sarin ................... | G11C 16/3418 365/185.02 |
| 2012/0113723 | A1* | 5/2012 | Sarin ................... | G11C 16/3418 365/185.19 |
| 2013/0163339 | A1* | 6/2013 | Kim ........................ | G11C 16/24 365/185.18 |
| 2014/0153338 | A1* | 6/2014 | Byeon .................... | G11C 16/28 365/185.21 |
| 2015/0085573 | A1* | 3/2015 | Sharon ................. | G06F 11/1048 365/185.03 |
| 2015/0270007 | A1* | 9/2015 | Sommer ............ | G11C 16/3404 365/185.09 |

* cited by examiner

*Primary Examiner* — Harry W Byrne
(74) *Attorney, Agent, or Firm* — Jianq Chyun IP Office

(57) ABSTRACT

A memory retry-read method, a memory storage device and a memory control circuit unit are provided. The method includes: setting a sequence of several retry-read parameter groups according to several weights of the retry-read parameter groups; reading data from a physical programming unit according to a read voltage; if the data are unable to be corrected by a corresponding ECC code, choosing an adjustment retry-read parameter group from the retry-read parameter groups; retrying reading new data from the physical programming unit according to the adjustment retry-read parameter group; if the new data are able to be corrected by the corresponding ECC code, determining the adjustment retry-read parameter group to be an available retry-read parameter group; and adjusting the weight of the available retry-read parameter group.

24 Claims, 9 Drawing Sheets

MEMORY RETRY-READ METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 106101855, filed on Jan. 19, 2017. The entirety of the above-mentioned patent application is hereby incorporated by reference herein and made a part of this specification.

BACKGROUND OF THE INVENTION

1. Technology Field

The disclosure relates to a memory retry-read method, and particularly relates to a memory retry-read method of a rewritable non-volatile memory module, and a memory control circuit unit and a memory storage device using the method.

2. Description of Related Art

The growth of digital cameras, mobile phones, and MP3 players has been rapid in recent years. Consequently, the consumers' demand for storage media has increased tremendously. Owing to the characteristics of data non-volatility, lower power consumption, smaller size, non-mechanical structure, and fast read and write speeds, rewritable non-volatile memory is most suitable for portable electronic products, such as laptops. A solid-state drive is a memory storage device adopting flash memory module as the storage medium. For these reasons, flash memory has become a popular part of the electronic industries.

Generally speaking, a physical programming unit in a flash memory module is formed by a plurality of memory cells arranged on the same word line. When data are to be programmed to the physical programming unit, storage states of the memory cells are defined by modifying threshold voltages of the memory cells, thereby storing data. However, due to various factors, such as wearing of the memory cells due to an excessive number of times of erasing, long time storage, reading disturb, and the like, a threshold voltage distribution of the memory cells of the flash memory module may be deviated, making the storage states of the memory cells not correctly identifiable. Thus, when a predetermined threshold voltage is applied to the word line to read the data stored in the physical programming unit, the read data may include erroneous bits.

When the data read from the physical programming unit include erroneous bits, a memory control circuit unit of the flash memory module may try to correct the read data. If the read data are unable to be corrected, the memory control circuit unit may execute a retry-read operation on the physical programming unit where a read operation is executed. Generally speaking, the memory control circuit unit may adjust a predetermined read voltage based on a retry-read parameter provided by the manufacturer, so as to execute the retry-read operation on the physical programming unit and thus obtain new data. However, during execution of the retry-read operation, the memory control circuit unit is only allowed to choose the retry-read parameter based on a fixed sequence of priority. Under this circumstance, if an effective retry-read parameter is lower-ranked in the sequence, the memory control circuit unit needs to choose a certain number of retry-read parameters to execute the retry-read operations before choosing the effective retry-read parameter. Thus, a certain amount of time may be spent on executing the retry-read operation.

Nothing herein should be construed as an admission of knowledge in the prior art of any portion of the disclosure. Furthermore, citation or identification of any document in this application is not an admission that such document is available as prior art to the disclosure, or that any reference forms a part of the common general knowledge in the art.

SUMMARY

The disclosure provides a memory retry-read method, a memory control circuit unit, and a memory storage device capable of reducing time for executing a retry-read operation.

An exemplary embodiment of the disclosure provides a memory retry-read method for a rewritable non-volatile memory module including a plurality of word lines. The method includes: setting a first sequence of a plurality of retry-read parameter groups based on a plurality of first weights of the retry-read parameter groups, each retry-read parameter group corresponding to one of the first weights. The method also includes: reading first data froze a first physical programming unit on a first word line based on a first read voltage; and choosing a first adjustment retry-read parameter group from the retry-read parameter groups based on the first sequence if the first data are unable to be corrected by a first corresponding error checking and correcting code. The method also includes: retrying reading first new data from the first physical programming unit based on the first adjustment retry-read parameter group. The method further includes: determining that the first adjustment retry-read parameter group is a first available retry-read parameter group if the first new data are able to be corrected by the first corresponding error checking and correcting code; and adjusting the first weight of the first available retry-read parameter group.

An exemplary of the disclosure provides a memory control circuit unit for controlling a rewritable non-volatile memory module including a plurality of word lines. The memory controller circuit unit includes a host interface, a memory interface, and a memory management circuit. The host interface is coupled to a host system. The memory interface is coupled to the rewritable non-volatile memory module. The memory management circuit is coupled to the host interface and the memory interface. The memory management circuit sets a first sequence of a plurality of retry-read parameter groups based on a plurality of first weights of the retry-read parameter groups. Each retry-read parameter group corresponds to one of the first weights. In addition, the memory management circuit sends a read command sequence to instruct to read first data from a first physical programming unit on a first word line based on a first read voltage. The memory management circuit chooses a first adjustment retry-read parameter group from the retry-read parameter groups based on the first sequence if the first data are unable to be corrected by a first corresponding error checking and correcting code. In addition, the memory management circuit retries reading first new data from the first physical programming unit based on the first adjustment retry-read parameter group. The memory management circuit determines that the first adjustment retry-read parameter group is a first available retry-read parameter group if the first new data are able to be corrected by the first corresponding error checking and correcting code, and adjusts the first weight of the first available retry-read parameter group.

An exemplary embodiment of the disclosure provides a memory storage device including a connection interface unit, a rewritable non-volatile memory module, and a memory control circuit unit. The connection interface unit is coupled to a host system. The rewritable non-volatile memory module includes a plurality of word lines. The memory control circuit unit is coupled to the connection interface unit and the rewritable non-volatile memory module. The memory control circuit unit sets a first sequence of a plurality of retry-read parameter groups based on a plurality of first weights of the retry-read parameter groups. Each retry-read parameter group corresponds to one of the first weights. In addition, the memory control circuit unit sends a read command sequence to instruct to read first data from a first physical programming unit on a first word line based on a first read voltage. The memory control circuit unit chooses a first adjustment retry-read parameter group from the retry-read parameter groups based on the first sequence if the first data are unable to be corrected by a first corresponding error checking and correcting code. In addition, the memory control circuit unit retries reading first new data from the first physical programming unit based on the first adjustment retry-read parameter group. If the first new data are able to be corrected by the first corresponding error checking and correcting code, the memory control circuit unit determines that the first adjustment retry-read parameter group is a first available retry-read parameter group and adjusts the first weight of the first available retry-read parameter group.

Based on the above, according to the disclosure, the sequence of all the retry-read parameter groups in the disclosure is able to be reset by adjusting the weight of the determined available retry-read parameter group. Thus, the available retry-read parameter group determined in a retry-read operation may be prioritized as the adjustment retry-read parameter group in the next retry-read operation. Accordingly, the time for determining the retry-read parameter group may be reduced, so as to effectively reduce the time for executing the retry-read operation.

To make the above features and advantages of the disclosure more comprehensible, embodiments accompanied with drawings are described in detail as follows.

It should be understood, however, that this Summary may not contain all of the aspects and embodiments of the disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
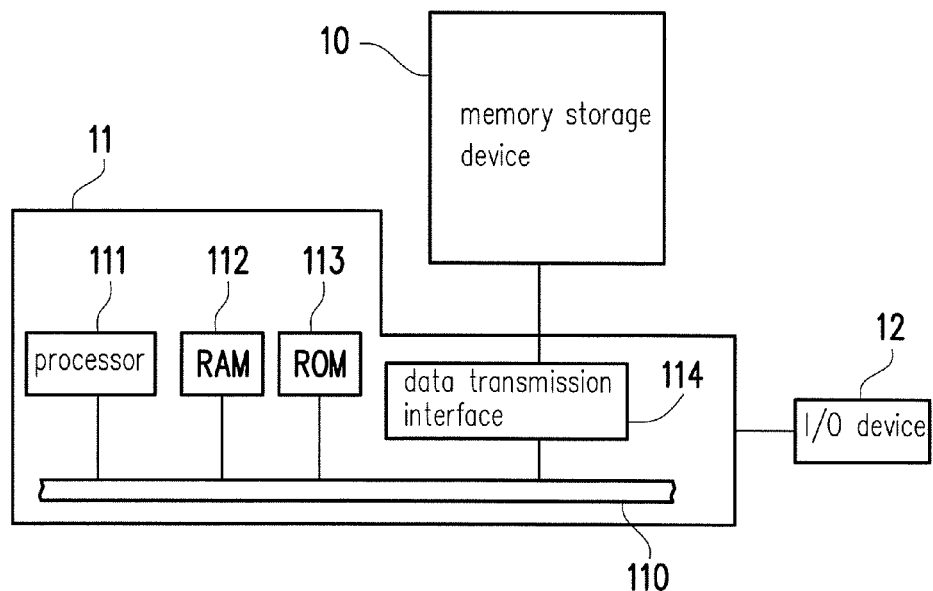
FIG. 1 is a schematic view illustrating a host system, a memory storage device, and an input/output (I/O) device according to an exemplary embodiment of the disclosure.

Reference will now be made in detail to the present exemplary embodiments of the disclosure, examples of which are illustrated in the accompanying drawings. Wherever possible, the same reference numbers are used in the drawings and the description to refer to the same or like parts.

Embodiments of the disclosure may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more," and "at least one" can be used interchangeably herein.

Generally speaking, a memory storage device (i.e. a memory storage system) includes a rewritable non-volatile memory module and a controller (i.e. a control circuit unit). The memory storage device is usually used together with a host system, such that the host system can write data into or read data from the memory storage device.

Figure 2:
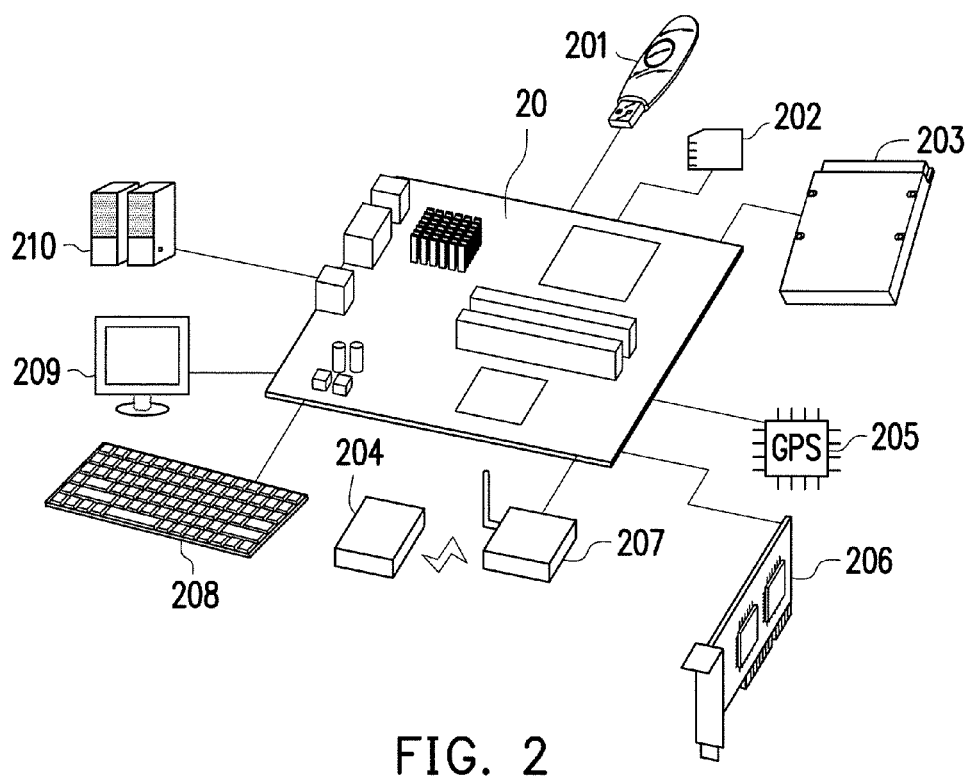
FIG. 2 is a schematic view illustrating a host system, a memory storage device, and an input/output (I/O) device according to another exemplary embodiment of the disclosure.

FIG. 1 is a schematic view illustrating a host system, a memory storage device, and an input/output (I/O) device according to an exemplary embodiment of the disclosure, and FIG. 2 is a schematic view illustrating a host system, a memory storage device, and an input/output (I/O) device according to another exemplary embodiment of the disclosure.

Referring to FIGS. 1 and 2, a host system 11 includes a processor 111, a random access memory (RAM) 112, a read only memory (ROM) 113, and a data transmission interface 114. The processor 111, the random access memory 112, the read only memory 113, and the data transmission interface 114 are coupled to a system bus 110.

In the exemplary embodiment, the host system 11 is coupled to a memory storage device 10 through the data transmission interface 114. For example, the host system 11 may write data to or read data from the memory storage device 10 through the data transmission interface 114. In addition, the host system 11 is coupled to the I/O device 12 through the system bus 110. For example, the host system 11 may transmit output signals to or receive input signals from the I/O device 12 through the system bus 110.

In the exemplary embodiment, the processor 111, the random access memory 112, the read only memory 113, and the data transmission interface 114 may be disposed on a motherboard 20 of the host system 11. One or more data transmission interfaces 114 may be provided. Through the data transmission interface 114, the motherboard 20 may be coupled to the memory storage device 10 in a wired or wireless manner. The memory storage device 10 may be a flash drive 201, a memory stick 202, a solid state drive (SSD) 203, or a wireless memory storage device 204, for example. The wireless memory storage device 204 may be a memory storage device based on a variety of wireless communication technologies, such as a near field communication (NFC) memory storage device, a wireless fidelity (WiFi) memory storage device, a Bluetooth memory storage device, or a Bluetooth low energy memory storage device (e.g., iBeacon), etc. In addition, the motherboard 20 may be coupled to an I/O device of any kind, such as a global positioning system (GPS) module 205, a network interface card 206, a wireless transmission device 207, a keyboard 208, a monitor 209, a speaker 210, etc., through the system bus 110. For example, in an exemplary embodiment, the motherboard 20 may access the wireless memory storage device 204 through the wireless transmission device 207.

Figure 3:
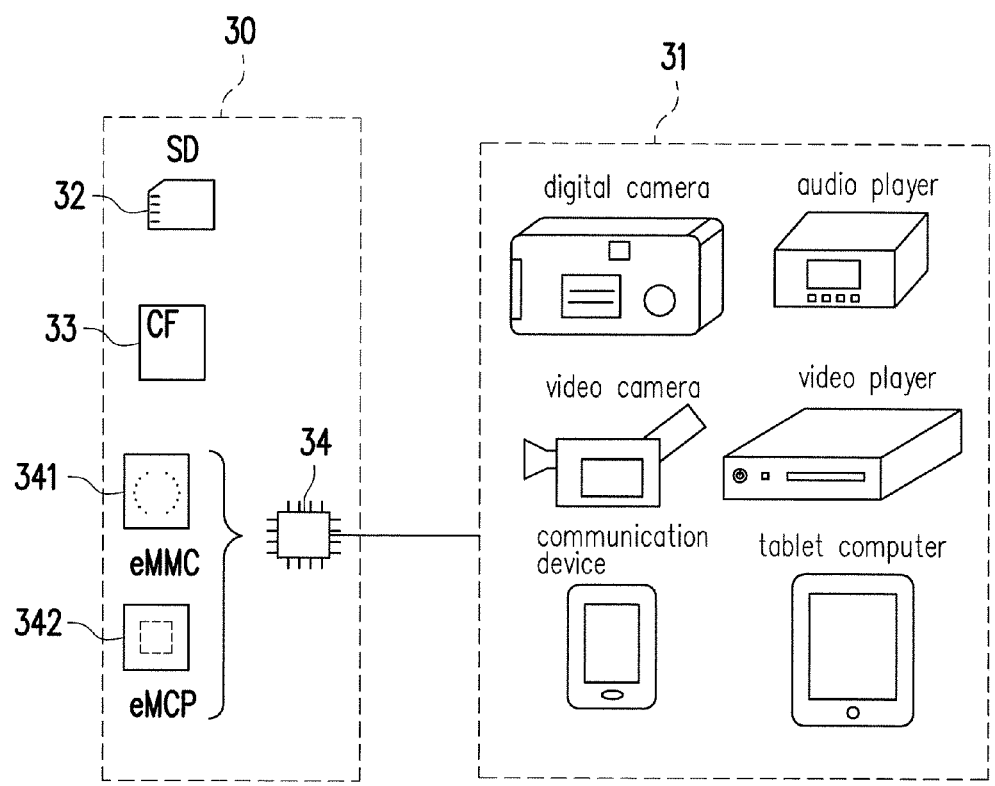
FIG. 3 is a schematic view illustrating a host system and a memory storage device according to another exemplary embodiment of the disclosure.

In an exemplary embodiment, the host system may be any system substantially capable of being used with a memory storage device to store data. Even though the host system is described as a computer system in the exemplary embodiment, FIG. 3 is a schematic view illustrating a host system and a memory storage device according to another exemplary embodiment of the disclosure. Referring to FIG. 3, in the exemplary embodiment, a host system 31 may also be a system such as a digital camera, a video camera, a communication device, an audio player, a video player, or a tablet computer, etc., and a memory storage device 30 may be a non-volatile memory storage device of any kind, such as a secure digital (SD) card 32, a compact flash (CF) card 33, or an embedded storage device 34, etc. The embedded storage device 34 includes an embedded storage device of any kind, where a memory module of any kind is directly coupled to a substrate of the host system, such as an embedded multimedia card (eMMC) 341 and/or an embedded multi-chip package (eMCP) storage device 342.

Figure 4:
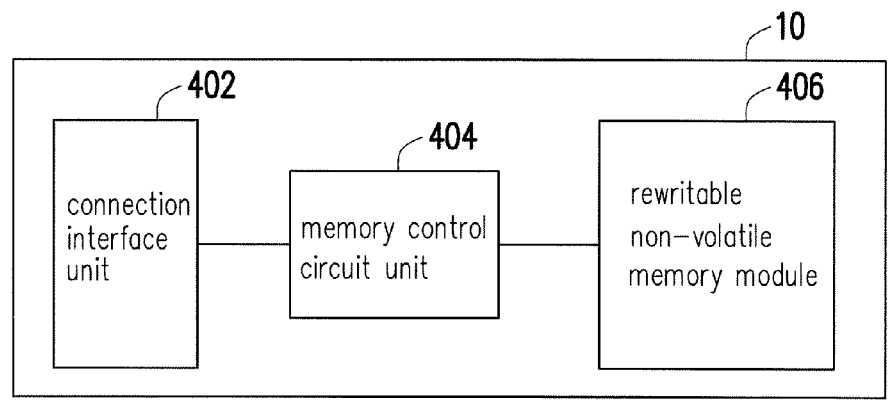
FIG. 4 is a schematic block view illustrating a host system and a memory storage device according to an exemplary embodiment of the disclosure.

FIG. 4 is a schematic block view illustrating a host system and a memory storage device according to an exemplary embodiment of the disclosure.

Referring to FIG. 4, the memory storage device 10 includes a connection interface unit 402, a memory control circuit unit 404, and a rewritable non-volatile memory module 406.

In the exemplary embodiment, the connection interface unit 402 is compatible with the serial advanced technology attachment (SATA) standard. However, the disclosure is not limited thereto. The connection interface unit 402 may also be compatible with the parallel advanced technology attachment (PATA) standard, the Institute of Electrical and Electronic Engineers (IEEE) 1394 standard, the peripheral component interconnect express (PCI Express) standard, the universal serial bus (USB) standard, the ultra high speed-I (UHS-I) interface standard, the ultra high speed-II (UHS-II) interface standard, the secure digital (SD) interface standard, the memory stick (MS) interface standard, the multi-chip package interface standard, the multimedia card (MMC) interface standard, the embedded multimedia card (eMMC) interface standard, the universal flash storage (UFS) interface standard, the embedded multi-chip package (eMCP) interface standard, the compact flash (CF) interface standard, the integrated device electronics (IDE) standard, or other suitable standards. In the exemplary embodiment, the connection interface unit 402 may be packaged with the memory control circuit unit 404 within the same chip, or the connection interface unit 402 may be disposed outside a chip that includes the memory control circuit unit.

The memory control circuit unit 404 is configured for executing a plurality of logic gates or control commands implemented in a hardware form or in a firmware form, and executing various data operations, such as data writing, data reading or data erasing, in the rewritable non-volatile memory module 406 according to the commands of the host system 11.

The rewritable non-volatile memory module 406 is coupled to the memory control circuit unit 404 and configured for storing data written by the host system 11. The rewritable non-volatile memory module 406 may be a single-level cell (SLC) NAND flash memory module (i.e., a flash memory module capable of storing data of 1 bit in one memory cell), a multi-level cell (MLC) NAND flash memory module (i.e., a flash memory module capable of storing data of 2 bits in one memory cell), a trinary-level cell (TLC) NAND flash memory module (i.e., a flash memory module capable of storing data of 3 bits in one memory cell), other flash memory modules, or other memory modules having the same characteristics.

In the exemplary embodiment, memory cells of the rewritable non-volatile memory module 406 form a plurality of physical programming units, and the physical programming units form a plurality of physical erasing units. For example, memory cells on the same word line form one or more physical programming units. If each memory cell stores data of two or more bits, the physical programming units on the same word line may at least be classified into a lower physical programming unit and an upper physical programming unit. For example, each memory cell of the SLC NAND flash memory stores data of one bit, so in the SLC NAND flash memory, the memory cells arranged on the same word line correspond to a physical programming unit. Compared to the SLC NAND flash memory, each memory cell of the MLC NAND flash memory stores data of two bits, and each storage state (i.e., "11", "10", "01", and "00") includes a least significant bit (LSB) and a most significant bit (MSB). For example, the value of the first bit from the left side in the storage state is the LSB, and the value of the second bit from the left side is the MSB. Accordingly, the memory cells arranged on the same word line may form two physical programming units. A physical programming unit formed by the LSBs of the memory cells is referred to as the lower physical programming units, and a physical programming unit formed by the MSBs of the memory cells is referred to as the upper physical programming unit. Generally speaking, in the MLC flash memory, the write speed of the lower physical programming unit is higher than the write speed of the upper physical programming unit, and/or the reliability of the lower physical programming unit is higher than the reliability of the upper physical programming unit.

Similarly, in the TLC NAND flash memory, each memory cell may store data of three bits, and each storage state (i.e., "111", "110", "101", "100", "011", "010", "001", and "000") includes the first bit from the left side as the LSB, the second bit from the left side as a center significant bit (CSB), and the third bit from the left side as the MSB. Therefore, the memory cells arranged on the same word line may form three physical programming units. A physical programming unit formed by the LSBs of the memory cells is referred to as the lower physical programming unit, a physical programming unit formed by the CSBs of the memory cells is referred to as a middle physical programming unit, and a physical programming unit formed by the MSBs of the memory cells is referred to as the upper physical programming unit.

In the exemplary embodiment, the physical programming unit is a minimum programming unit. Namely, the physical programming unit is a minimum unit for writing data. For example, the physical programming unit is a physical page or a physical sector. If the physical programming unit is a physical page, the physical programming unit normally includes a data bit area and a redundant bit area. The data bit area includes a plurality of physical sectors and is configured to store user data, whereas the redundant bit area is configured to store system data (e.g., error checking and correcting (ECC) code). In the exemplary embodiment, the data bit area includes 32 physical sectors, and the size of each physical sector is 512 bytes. However, in other exemplary embodiments, the data bit area may also include 8, 16, or more or fewer physical sectors, and the size of each physical sector may be greater or smaller. Besides, the physical erasing unit is a minimum erasing unit. Namely, each physical erasing unit has a minimum number of memory cells to be erased together. For example, the physical erasing unit may be a physical block.

In the exemplary embodiment, each memory cell in the rewritable non-volatile memory module 406 stores one or more bits by modifying a voltage (also referred to as a threshold voltage). Specifically, a charge trapping layer is provided between a channel and a control gate of each memory cell. By applying a write voltage to the control gate, a quantity of electrons of the charge trapping layer may be modified, so as to modify the threshold voltage of the memory cell. The operation of modifying the threshold voltage may also be referred to as "writing data to a memory cell" or "programming a memory cell". By modifying the threshold voltage, each memory cell of the rewritable non-volatile memory module 406 may have a plurality of storage states. By applying a read voltage, the storage state of a memory cell may be determined, and the one or more bits stored in the memory cell are retrieved.

Figure 5:
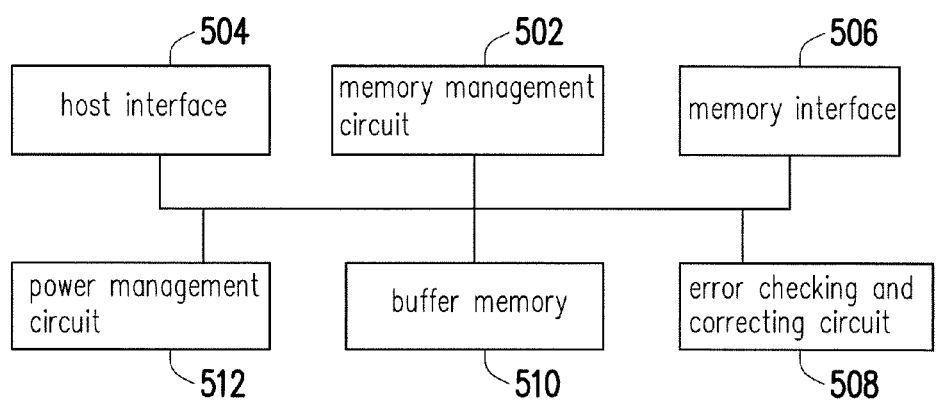
FIG. 5 is a schematic block view illustrating a memory control circuit unit according to an exemplary embodiment of the disclosure.

FIG. 5 is a schematic block view illustrating a memory control circuit unit according to an exemplary embodiment of the disclosure.

Referring to FIG. 5, the memory control circuit unit 404 includes a memory management circuit 502, a host interface 504, a memory interface 506, a buffer memory 510, a power management circuit 512, and an error checking and correcting (ECC) circuit 508.

The memory management circuit 502 is configured for controlling the overall operation of the memory control circuit unit 404. Specifically, the memory management circuit 502 has a plurality of control commands. When the memory storage device 10 is operated, the control commands are executed to execute various data operation such as data writing, data reading and data erasing.

In the exemplary embodiment, the control commands of the memory management circuit 502 are implemented in a firmware form. For instance, the memory management circuit 502 has a microprocessor (not shown) and a read-only memory (not shown), and the control commands are burnt into the read-only memory. When the memory storage device 10 is operated, the control commands are executed by the microprocessor for various data operations, such as data writing, data reading and data erasing.

According to another exemplary embodiment of the disclosure, the control commands of the memory management circuit 502 may also be stored in a specific area (for example, the system area in the memory module exclusively used for storing system data) of the rewritable non-volatile memory module 406 as programming codes. Moreover, the memory management circuit 502 has a microprocessor unit (not shown), a read-only memory (not shown), and a random access memory (not shown). Specifically, the read-only memory has a boot code. When the memory control circuit unit 404 is enabled, the boot code is firstly executed by the microprocessor unit for loading the control commands stored in the rewritable non-volatile memory module into the random access memory of the memory management circuit 502. Afterwards, the microprocessor unit executes the control commands for various data operation such as data writing, data reading and data erasing.

Additionally, according to another exemplary embodiment of the disclosure, the control commands of the memory management circuit 502 may be implemented in a hardware form. For example, the memory management circuit 502 includes a microcontroller, a memory management circuit, a memory writing circuit, a memory reading circuit, a memory erasing circuit, and a data processing circuit. The memory management circuit, the memory writing circuit, the memory reading circuit, the memory erasing circuit, and the data processing circuit are coupled to the microcontroller. The memory management unit is configured for managing the physical erasing units of the rewritable non-volatile memory module 406, the memory writing circuit is configured for sending a write command to the rewritable non-volatile memory module 406 to write data into the rewritable non-volatile memory module 406, the memory reading circuit is configured for sending a read command to the rewritable non-volatile memory module 406 to read data from the rewritable non-volatile memory module 406, the memory erasing circuit is configured for sending an erase command to the rewritable non-volatile memory module 406 to erase data from the rewritable non-volatile memory module 406, and the data processing unit is configured for processing both the data to be written into and the data to be read from the rewritable non-volatile memory module 406.

The host interface 504 is coupled to the memory management circuit 502 and configured to be coupled to the connection interface unit 402, so as to receive and identify commands and data transmitted by the host system 11. In other words, the commands transmitted by the host system 11 are transmitted to the memory management circuit 502 through the host interface 504. In the exemplary embodiment, the host interface 504 is compatible with the SATA standard. However, it should be understood that the disclosure is not limited thereto, and the host interface 504 may also be compatible with the PATA standard, the IEEE 1394 standard, the PCI Express standard, the USB standard, the UHS-I interface standard, the UHS-II interface standard, the SD standard, the MS standard, the MMC standard, the CF standard, the IDE standard, or other suitable standards for data transmission.

The memory interface 506 is coupled to the memory management circuit 502 for accessing the rewritable non-volatile memory module 406. In other words, data desired to be written into the rewritable non-volatile memory module 406 is converted as an acceptable format to the rewritable non-volatile memory module 406 by the memory interface 506.

The buffet memory 510 is coupled to the memory management circuit 502 and configured for temporarily storing data and commands from the host system 11 or data from the rewritable non-volatile memory module 406.

The power management circuit 512 is coupled to the memory management circuit 502 and configured for controlling the power of the of the memory storage device 10.

The ECC circuit 508 is coupled to the memory management circuit 502 and configured for carrying out an error checking and correcting procedure to ensure the accuracy of data. Specifically, when the memory management circuit 502 receives the write command from the host system 11, the ECC circuit 508 may generate an error checking and correcting (ECC) code corresponding to data corresponding to the write command, and the memory management circuit 502 writes the data corresponding to the write command and the corresponding ECC code to the rewritable non-volatile memory module 406. Subsequently, when the memory management circuit 502 reads the data from the rewritable non-volatile memory module 406, the ECC code corresponding to the data is also read by the rewritable non-volatile memory module 406 simultaneously, and the ECC circuit 508 executes the error checking and correcting procedure for the read data based on the ECC code.

It is noted that in the following description, some terms may be replaced with corresponding abbreviations for ease of reading (see Table 1).

TABLE 1

| logical-physical mapping table | L-P Table |
| logical-to-physical mapping table | L2P table |
| physical-to-logical mapping table | P2L table |
| rewritable non-volatile memory module | RNVM module |
| physical unit | PU |
| physical erasing unit | PEU |
| physical programming unit | PPU |
| logical unit | LU |
| logical erasing unit | LEU |
| logical programming unit | LPU |
| memory management circuit | MMC |
| memory control circuit unit | MCCU |
| error checking and correcting circuit | ECCC |

Figure 6:
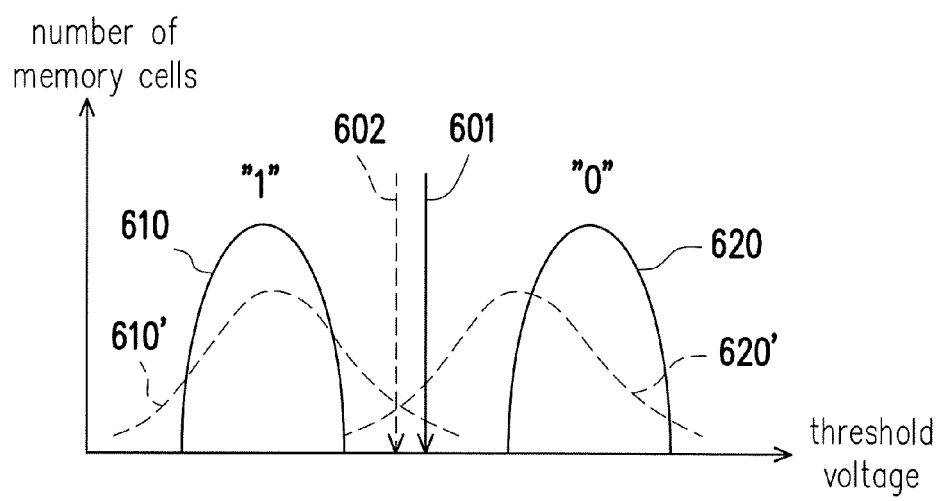
FIG. 6 is a schematic view illustrating a threshold voltage distribution of memory cells according to an exemplary embodiment of the disclosure.

FIG. 6 is a schematic view illustrating a threshold voltage distribution of memory cells according to an exemplary embodiment of the disclosure.

In FIG. 6, the horizontal axis represents to a threshold voltage of the memory cell, and the vertical axis represents to the number of memory cells.

Referring to FIG. 6, it is assumed that a state 610 corresponds to the bit "1", and a state 620 corresponds to the bit "0". If the threshold voltage of a memory cell belongs to the state 610, the memory cell stores the bit "1". Alternatively, if the threshold voltage of a memory cell belongs to the state 620, the memory cell stores the bit "0". It should be noted that, in the exemplary embodiment, a state in the threshold voltage distribution corresponds to a bit value (i.e., "0" or "1"), and the threshold voltage distribution of the memory cells has two possible states. However, in other exemplary embodiments, each state in the threshold voltage distribution may also correspond to a plurality of bit values, and the threshold voltage distribution of the memory cells may have four, eight, or an arbitrary number of states. Moreover, the disclosure imposes no limitation on the bit represented by each state. For example, in another exemplary embodiment, the state 610 may also correspond to the bit "0", and the state 620 may correspond to the bit "1".

In the exemplary embodiment, when data are to be read from the RNVM module 406, the MMC 502 may send a read command sequence to the RNVM module 406. The read command sequence serves to instruct the RNVM module 406 to read data from a plurality of memory cells (also referred to as first memory cells). In the exemplary embodiment, the first memory cells belong to the same first PPU. However, in another exemplary embodiment, the first memory cells may belong to different PPUs. In a case where the threshold voltage distribution is not deviated, a threshold voltage distribution of the first memory cells has the state 610 and the state 620. According to the read command sequence, the RNVM module 406 may read data from the first memory cells based on a read voltage 601 in FIG. 6. The read voltage 601 may be a predetermined read voltage set in a factory setting of the RNVM module 406 serving to identify the state 610 and the state 620 of the first memory cells. In other words, memory cells of the first memory cells whose threshold voltages are lower than the read voltage 601 are turned on, and the MMC 502 may read the bits "1". Alternatively, memory cells of the first memory cells whose threshold voltages are higher than the read voltage 601 are turned off, and the MMC 502 may read the bits "0".

However, due to various factors, such as data being stored for a long period of time, wearing of memory cells, reading disturb, and the like, the threshold voltage distribution of the first memory cells may be deviated, making the storage states of the first memory cells not correctly identifiable based on the read voltage 601.

If the threshold voltage distribution of the first memory cells is already deviated, the state 610 and the state 620 of the threshold voltage distribution are also deviated and become a state 610' and a state 620' respectively. Under the circumstance, some memory cells of the first memory cells are supposed to store the bits "1" (i.e., belonging to the state 610') but have threshold voltages greater than the read voltage 601 being applied, while some memory cells of the first memory cells are supposed to store the bits "0" (i.e., belonging to the state 620') and have threshold voltages lower than the read voltage 601 being applied. In other words, in the data read by applying the read voltage 601, some of the bits are erroneous. Thus, after receiving the read data from the RNVM module 406, the ECC circuit 508 may also read the ECC code corresponding to the read data to verify whether the read data include any error. If it is determined that the read data include an error, the ECC circuit 508 may execute a decoding operation to try to correct the error in the read data. When the error in the read data is unable to be decoded by the ECC circuit 508 (e.g., the number of erroneous bits exceed the protection capability of the ECC circuit 508), the read data are unable to be corrected and erroneous data are thus generated.

In the exemplary embodiment, when the read data are unable to be corrected, the MMC 502 may execute a retry-read operation to the PPUs on the word line where the read operation is executed, so as to obtain data that are able to be corrected by the ECC circuit 508. In the execution of the retry-read operation, the MMC 502 may determine an available retry-read parameter group from a plurality of retry-read parameter groups, and data are read again from a first PPU on a first word line based on the determined available retry-read parameter group, so as to obtain correct data.

Each of the retry-read parameter group may include at least one parameter. For example, the parameter of the retry-read parameter group may include one or more read voltage adjustment values. The read voltage adjustment value may be a parameter provided by the manufacturer of the RNVM module 406. Therefore, the MMC 502 may obtain an available read voltage based on the read voltage adjustment value included in the retry-read parameter group. When the available read voltage is applied to the RNVM module 406 to read data from a PPU, the read data may be corrected by the ECC circuit 508. However, in another exemplary embodiment, the parameter of a retry-read parameter group may also be a read speed adjustment value, and the MMC 502 may adjust a clock frequency when a read operation is executed based on the read speed adjustment value. Moreover, in another exemplary embodiment, a soft bit voltage level corresponding to decodable data may serve as a parameter in the retry-read parameter group. Accordingly, the MMC 502 may execute the retry-read operation based on the soft bit voltage level of the retry-read parameter group. However, the foregoing parameters merely serve as examples, and the disclosure imposes no limitation on the parameter in the retry-read parameter group.

In the exemplary embodiment, each retry-read parameter group has one or more corresponding weights. In addition, the MMC 502 may arrange a sequence of the retry-read parameter groups based on the weights of the retry-read parameter groups, and may choose a retry-read parameter group (also referred to as adjustment retry-read parameter group) for executing the retry-read operation based on the arranged sequence of the retry-read parameter groups. For example, assuming that the parameter of the retry-read parameter groups is the read voltage adjustment value, such as an example shown in FIG. 6, the MMC 502 chooses the adjustment retry-read parameter group based on the sequence, and adjusts the read voltage 601 to a read voltage 602 based on the read voltage adjustment value of the adjustment retry-read parameter group. Moreover, the MMC 502 sends a read command sequence to instruct to retry reading data from the first PPU based on the read voltage 602. If the data read from the first PPU by applying the read voltage 602 are able to be corrected by the ECC circuit 508, the chosen adjustment retry-read parameter group serves as the available retry-read parameter group. Alternatively, if the data read from the first PPU by applying the read voltage 602 are unable to be corrected by the ECC circuit 508, the MMC 502 may again execute the operation of choosing the adjustment retry-read parameter group until the available retry-read parameter group is determined.

Even though the data stored in the first PPU are read based on the read voltage in the exemplary embodiment, the disclosure is not limited thereto. In another exemplary embodiment, the data stored in the first PPU may also be read based on a plurality of read voltages. Moreover, a parameter in a retry-read parameter group may include a plurality of read voltage adjustment values, and the MMC 502 may adjust a plurality of read voltages for reading data from the first PPU based on the read voltage adjustment values.

After determining the available retry-read parameter group, the MMC 502 may adjust the weight of the available retry-read parameter group. In an exemplary embodiment, the MMC 502 may further adjust the weights of other retry-read parameter groups based on the adjusted weight of the available retry-read parameter group. Moreover, the MMC 502 may reset the sequence of all the retry-read parameter groups based on the adjusted weights.

Figure 7:
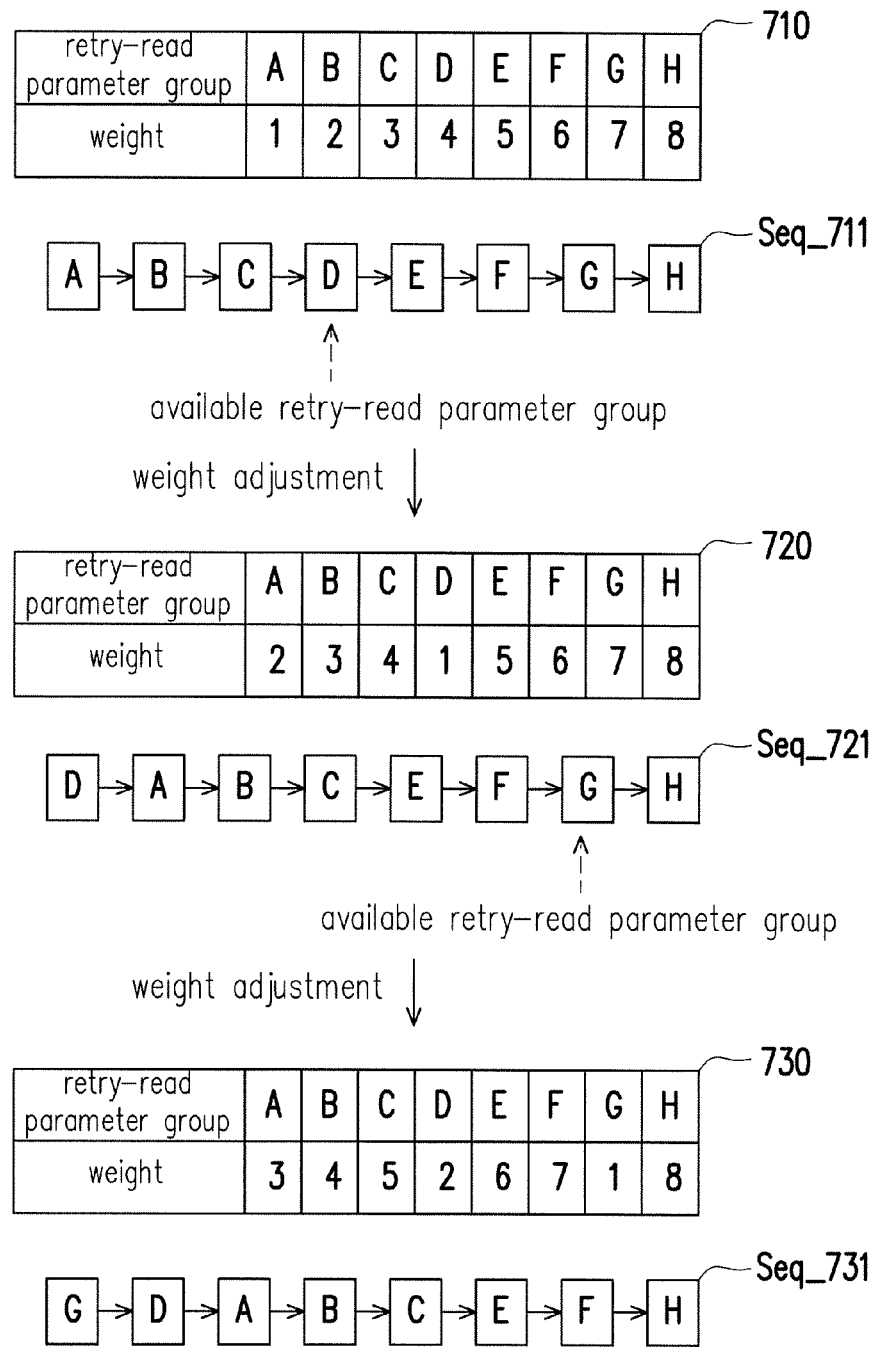
FIG. 7 is a schematic view illustrating adjusting weights and sequences of retry-read parameter groups according to an exemplary embodiment of the disclosure.

FIG. 7 is a schematic view illustrating adjusting weights and sequences of retry-read parameter groups according to an exemplary embodiment of the disclosure. For the ease of descriptions, the following exemplary embodiment is described by taking the example of applying a first read voltage to the first word line to read data stored in the first PPU on the first word line. Also, a retry-read parameter group in the exemplary embodiment corresponds to a weight (also referred to as first weight).

Referring to FIG. 7, the retry-read parameter group for executing the retry-read operation includes retry-read parameter groups A to H. The retry-read parameter groups A to H respectively have corresponding weights, and are ordered based on the weights. When the RNVM module 406 is manufactured, the weights of the retry-read parameter groups A to H may respectively be initial weight values. Based on the initial weight values, the retry-read parameter groups A to H are initially ordered in an initial sequence. In the exemplary embodiment, the initial weight values may be provided by the manufacturer. As shown in a weight record table 710, the initial weight values of the retry-read parameter groups A to H are 1 to 8, respectively. Therefore, the retry-read parameter groups A to H are ordered in a sequence Seq_711 based on the initial weight values. Here, the weight value "1" represents the highest weight value, whereas the weight value "8" indicates the lowest weight value. The MMC 502 may order the retry-read parameter groups A to H in a sequence from the highest weight value to the lowest weight value. Therefore, the retry-read parameter groups A to H are ordered in the sequence Seq_711 based on the initial weight values. It should be noted that the eight retry-read parameter groups A to H of the exemplary embodiment merely serve as an example. However, in other exemplary embodiments, more or fewer retry parameter groups may be set. The disclosure imposes no limitation on the number of the retry-read parameter groups.

When data read from the first PPU based on the first read voltage are unable to be corrected by the ECC circuit 508, the MMC 502 may execute the retry-read operation to the first PPU based on the retry-read parameter groups A to H. The first read voltage may be a predetermined read voltage. When the MMC 502 executes the retry-read operation for the first time, the MMC 502 may firstly choose the retry-read parameter group A as the adjustment retry-read parameter group based on the initial sequence (i.e., the sequence Seq_711), so as to execute the retry-read operation. In the exemplary embodiment, each of the retry-read parameter groups A to H includes a parameter of a read voltage adjustment value, for example. The MMC 502 adjusts the read voltage to a new read voltage based on the read voltage adjustment value of the retry-read parameter group A. Moreover, the MMC 502 sends a read command sequence to instruct to read new data (also referred to as first new data) from the first PPU based on the new read voltage. If the new data read based on the new read voltage are unable to be corrected, the MMC 502 may choose the retry-read parameter group B as the adjustment retry-read parameter group based on the sequence Seq_711 and execute the retry-read operation, so as to obtain new data again. Based on the same principle, the MMC 502 chooses the retry-read parameter group D as the adjustment retry-read parameter group based on the sequence Seq_711 to adjust the read voltage, and the new data read based on the adjusted new read voltage are able to be corrected correctly. Thus, the MMC 502 may determine that the retry-read parameter group D is the available retry-read parameter group of the retry-read operation currently executed.

In the exemplary embodiment, the MMC 502 may record the determined available retry-read parameter group as a recently used retry-read parameter group, and adjust the weights of all the retry-read parameter groups based on the recently used retry-read parameter group. The MMC 502 may adjust the weight of the recently used retry-read parameter group from a lower weight value to a higher weight value, and adjust the weights of other retry-read parameter groups from higher weight values to lower weight values. For example, the MMC 502 records the retry-read parameter group D as the recently used retry-read parameter group and adjusts the weight of the retry-read parameter group D from the weight value "4" to the weight value "1" (i.e., the highest weight value). In the exemplary embodiment, the MMC 502 may respectively adjust the weights of the retry-read parameter groups A to C to the weight values "2", "3", and "4", and the weights of the retry-read parameter groups E to H remain unchanged, as shown in a weight record table 720. Based on the adjusted weights, the MMC 502 resets the sequence of the retry-read parameter groups A to H as a sequence Seq_721.

However, in another exemplary embodiment, the MMC 502 may respectively adjust the weights of the retry-read parameter groups E to H to the weight values "2", "3", "4", and "5", and respectively adjust the weights of the retry-read parameter groups A to C to "6", "7", and "8". In other words, the MMC 502 reset the sequence of the retry-read parameter groups A to H as DEFGHABC based on the adjusted weights.

Since the memory cells of the rewritable non-volatile memory 406 are ill similar statuses, the reasons leading to the deviation of the threshold voltage distribution of the memory cells may also be similar. Thus, the recently used retry-read parameter group (i.e., the available retry-read parameter group) has a higher chance to also be determined as the available retry-read parameter group in the next retry-read parameter operation. Therefore, by adjusting the weight of the recently used retry-read parameter group to the highest weight value, the recently used retry-read parameter group may be prioritized as the adjustment retry-read parameter group in the next retry-read operation.

When the next time the retry-read operation is executed, the MMC 502 may refer to the sequence Seq_721 to prioritize the retry-read parameter group D as the adjustment retry-read parameter group, and determine the available retry-read parameter group based on the steps. Assuming that the MMC 502 determines the retry-read parameter group G to be the available retry-read parameter group based on the sequence Seq_721, the MMC 502 may record the retry-read parameter group G to be the recently used retry-read parameter group, adjust the weight of the retry-read parameter group G from the weight value "7" to the weight value "1", and add 1 to the weight value of each of the retry-read parameter groups A to F to adjust the weights of the retry-read parameter groups A to F. For example, as shown in a weight record table 730, the weight of the retry-read parameter group D is adjusted from the weight value "1" to the weight value "2", the weight of the retry-read parameter group A is adjusted from the weight value "2" to the weight value "3", and the weight of the retry-read parameter group F is adjusted from the weight value "6" to the weight value "7". Accordingly, based on the adjusted weights, the MMC 502 resets the sequence of the retry-read parameter groups A to H as a sequence Seq_731.

Figure 8:
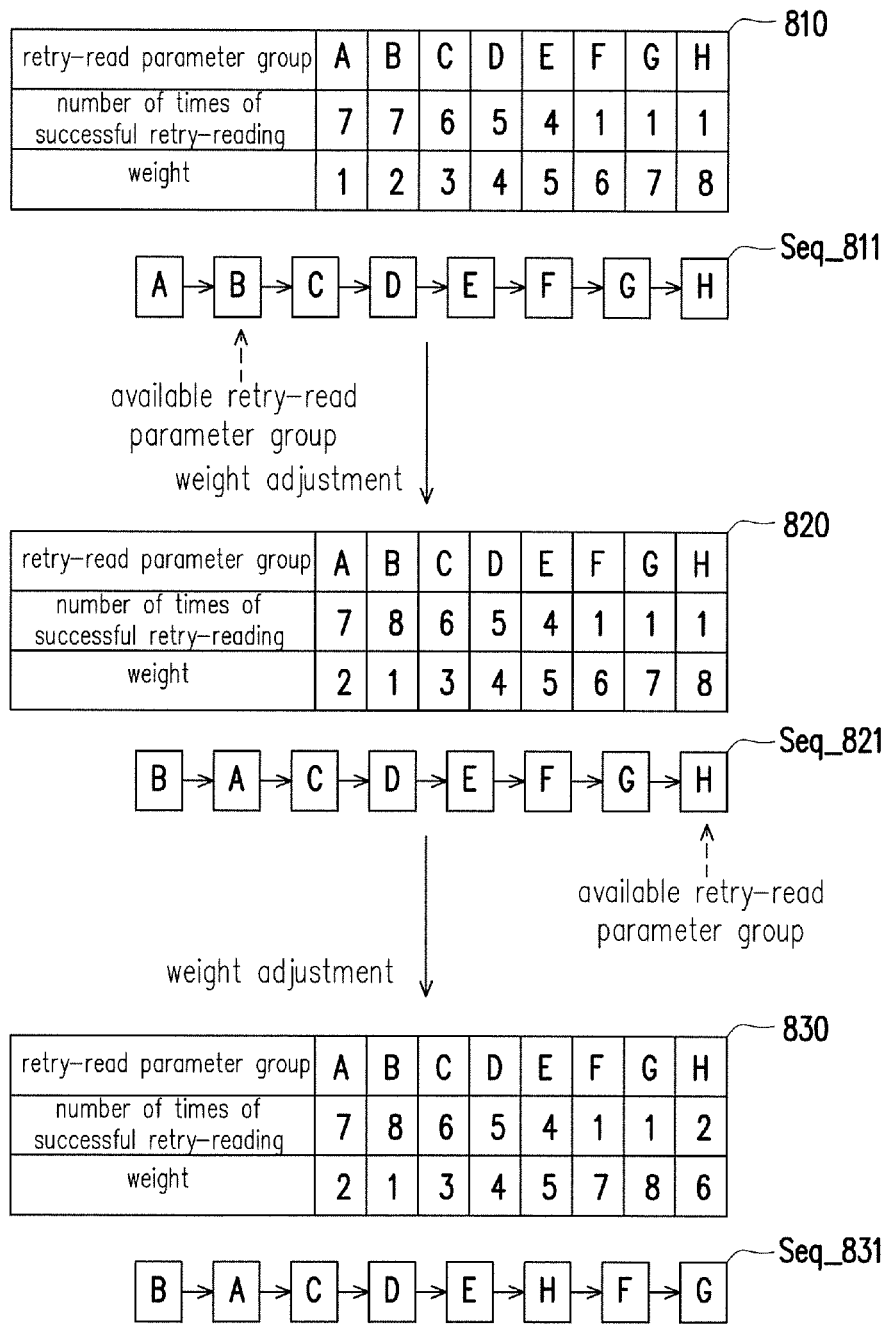
FIG. 8 is a schematic view illustrating adjusting weights and sequences of retry-read parameter groups according to another exemplary embodiment of the disclosure.

FIG. 8 is a schematic view illustrating adjusting weights and sequences of retry-read parameter groups according to another exemplary embodiment of the disclosure. What differs from the embodiment shown in FIG. 7 is that, in the embodiment shown in FIG. 8, the MMC 502 may record the numbers of times of successful retry-reading of the retry-read parameter groups, and adjust the weights based on the numbers of times of successful retry-reading.

Referring to FIG. 8, if a retry-read parameter group is determined as the available retry-read parameter group, the number of times of successful retry-reading of the retry-read parameter group is updated. In the exemplary embodiment, it is assumed that the current numbers of times of successful retry-reading and weights of the retry-read parameter groups A to H are as shown in a weight record table 810. For example, the numbers of times of successful retry-reading of the retry-read parameter groups A and B are respectively "7", the weights of the retry-read parameter groups A and B are respectively the weight value "1" and the weight value "2", and the retry-read parameter groups are ordered in a sequence Seq_811. In a retry-read operation, the MMC 502 determines that the retry-read parameter group B is the available retry-read parameter group based on the sequence Seq_811. Under this circumstance, the MMC 502 may add 1 to the number of times of successful retry-reading of the retry-read parameter group B, so as to update the number of times of successful retry-reading of the retry-read parameter group B to "8". Then, the MMC 502 may compare the number of times of successful retry-reading of the retry-read parameter group B with the numbers of times of successful retry-reading of other retry-read parameter groups, and determine that the retry-read parameter group B has the most number of times of successful retry-reading. Thus, the MMC 502 sets the weight of the retry-read parameter group B as the weight value "1", and adds 1 to the weight value of the retry-read parameter group A to update the weight of the retry-read parameter group A to the weight value "2", as shown in a weight record table 820. Accordingly, based on the adjusted weights, the MMC 502 resets the sequence of the retry-read parameter groups A to H as a sequence Seq_821. Namely, when the next time the retry-read operation is executed, the MMC 502 may prioritize the read-retry parameter group B with the most number of times of successful retry-reading as the adjustment retry-read parameter group based on the sequence Seq_821. Since the retry-read parameter group having a greater number of times of successful retry-reading has a higher chance to be the available retry-read parameter group in the next retry-read operation, the weight of the retry-read parameter group having a greater number of times of successful retry-reading is adjusted to a higher weight value, so that the retry-read parameter group having a higher chance to be the available retry-read parameter group may be prioritized to execute the retry-read operation in the next retry-read operation.

Assuming that in the next retry-read operation, the MMC 502 determines that the retry-read parameter group H is the available retry-read parameter group based on the sequence Seq_821, the MMC 502 may update the number of times of successful retry-reading of the retry-read parameter group H to "2", as shown in a weight record table 831. Based on the updated number of times of successful retry-reading (i.e., "2") of the retry-read parameter group H, the MMC 502 determines that the number of times of successful retry-reading of the retry-read parameter group H is greater than the numbers of times of successful retry-reading of the retry-read parameter groups F and G. Therefore, the MMC 502 adjusts the weight of the retry-read parameter group H to the weight value "6", and adds 1 to the weight values of the retry-read parameter groups F and G respectively to adjust the weights of the retry-read parameter groups F and G to the weight values "7" and "8", respectively. Accordingly, based on the adjusted weights, the MMC 502 resets the sequence of the retry-read parameter groups A to H as a sequence Seq_831.

In the exemplary embodiment, the MMC 502 may store the adjusted weights of the retry-read parameter groups to the RNVM module 406. However, in another exemplary embodiment, the MMC 502 may also refrain from storing the adjusted weights of the retry-read parameter groups to the RNVM module 406.

Figure 9:
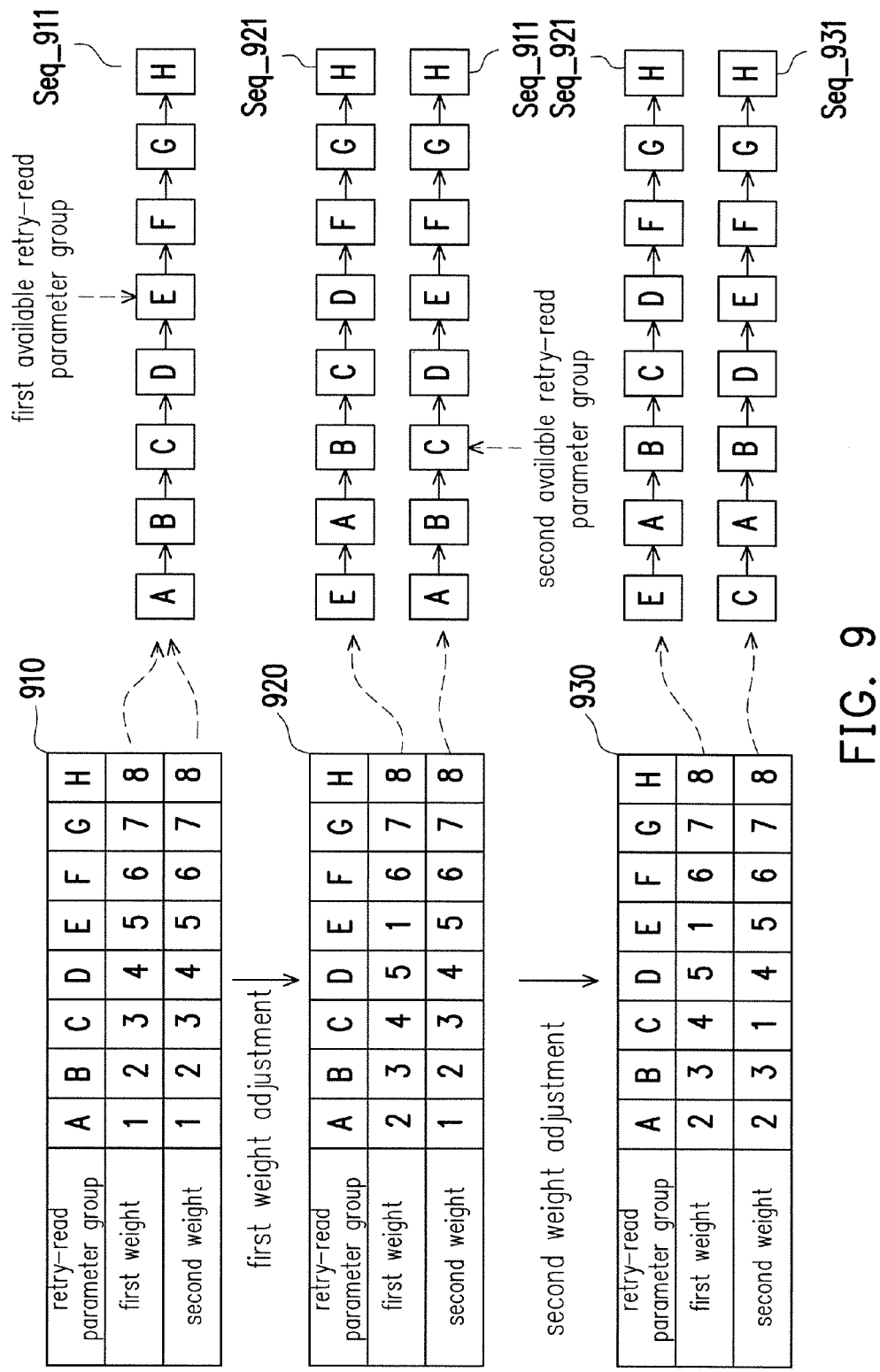
FIG. 9 is a schematic view illustrating adjusting weights and sequences of retry-read parameter groups according to another exemplary embodiment of the disclosure.

FIG. 9 is a schematic view illustrating adjusting weights and sequences of retry-read parameter groups according to another exemplary embodiment of the disclosure. In the exemplary embodiment shown in FIG. 9, an MLC NAND flash memory is described as an example. In other words, the memory cells on the same word line may form a lower PPU and an upper PPU. In addition, each of the retry-read parameter groups A to H corresponds to two weights, i.e., a first weight and a second weight.

Referring to FIG. 9, as shown in a weight record table 910, the retry-read parameter groups A to H may initially correspond to the same first and second weights. Therefore, a sequence (also referred to as a first sequence) corresponding to the first weights and a sequence (also referred to as a second sequence) corresponding to the second weights may initially correspond to the same sequence Seq_911.

In the exemplary embodiment, the MMC 502 may adjust the first and second weights of the retry-read parameter groups A to H based on results of retry-read operations executed on the lower PPU and the upper PPU respectively.

When data read from the lower PPU are unable to be corrected, the MMC 502 may choose the adjustment retry-read parameter group based on the sequence Seq_911 corresponding to the first weights to execute the retry-read operation, so as to determine the available retry-read parameter group (also referred to as first available retry-read parameter group). It is assumed that in the current retry-read operation, the retry-read parameter group E is determined as the first available retry-read parameter group. As shown in a weight record table 920, the MMC 502 may adjust the first weight of the retry-read parameter group E to the weight value "1", and respectively adjust the first weights of the retry-read parameter groups A to D to the weight values "2", "3", "4", and "5", respectively. Accordingly, the first sequence of the retry-read parameter groups A to H is set as a sequence Seq_921. When the next time the retry-read operation is to be executed on any lower PPU, the MMC 502 may determine the first available retry-read parameter group based on the sequence Seq_921.

At this time, since the second weights remain unadjusted, the second sequence of the retry-read parameter groups A to H is still the sequence Seq_911. When data (also referred to as second data) read from the upper PPU (also referred to as second PPU) are unable to be corrected, the MMC 502 may choose the adjustment retry-read parameter group based on the second sequence (i.e., the sequence Seq_911) to execute the retry-read operation, so as to determine the available retry-read parameter group (also referred to as second available retry-read parameter group). It is assumed that, in the current retry-read operation, the MMC 502 sequentially chooses the retry-read parameter groups A, B, and C as the adjustment retry-read parameter group and determines that the retry-read parameter group C is the second available retry-read parameter group. As shown in a weight record table 930, the MMC 502 may adjust the second weight of the retry-read parameter group C to the weight value "1", and respectively adjust the second weights of the retry-read parameter groups A and B to the weight value "2" and the weight value "3". Accordingly, the sequence corresponding to the second weights of the retry-read parameter groups A to H is set as a sequence Seq_931. When the next time the retry-read operation is to be executed on any upper PPU, the MMC 502 may determine the second available retry-read parameter group based on the sequence Seq_931.

In other words, the MMC 502 may determine whether to adopt the sequence corresponding to the first weights or the sequence corresponding to the second weights based on whether the PPU where the retry-read operation is executed is the lower PPU or the upper PPU. Even though the exemplary embodiment here describes an MLC NAND flash memory as an example, the disclosure is not limited thereto. Based on the principle, the retry-read operation may also be carried out for other types of multi-level NAND flash memory. Taking the TLC NAND flash memory as an example, the retry-read parameter groups A to H may respectively correspond to three weights (e.g., first, second and third weights). The MMC 502 may execute the retry-read operation on the lower PPU, the middle PPU, and the upper PPU respectively based on the sequence corresponding to the first weights, the sequence corresponding to the second weights, and the sequence corresponding to the third weights, and respectively update the first weights, the second weights, and the third weights.

Besides, even though in the exemplary embodiment, the available retry-read parameter group (i.e., the recently used retry-read parameter group) determined in each retry-read operation is adjusted to the highest weight value, the weights of the retry-read parameter groups may also be adjusted based on the number of times of successful retry-reading or other means, and the disclosure imposes no limitation in this regard.

Figure 10:
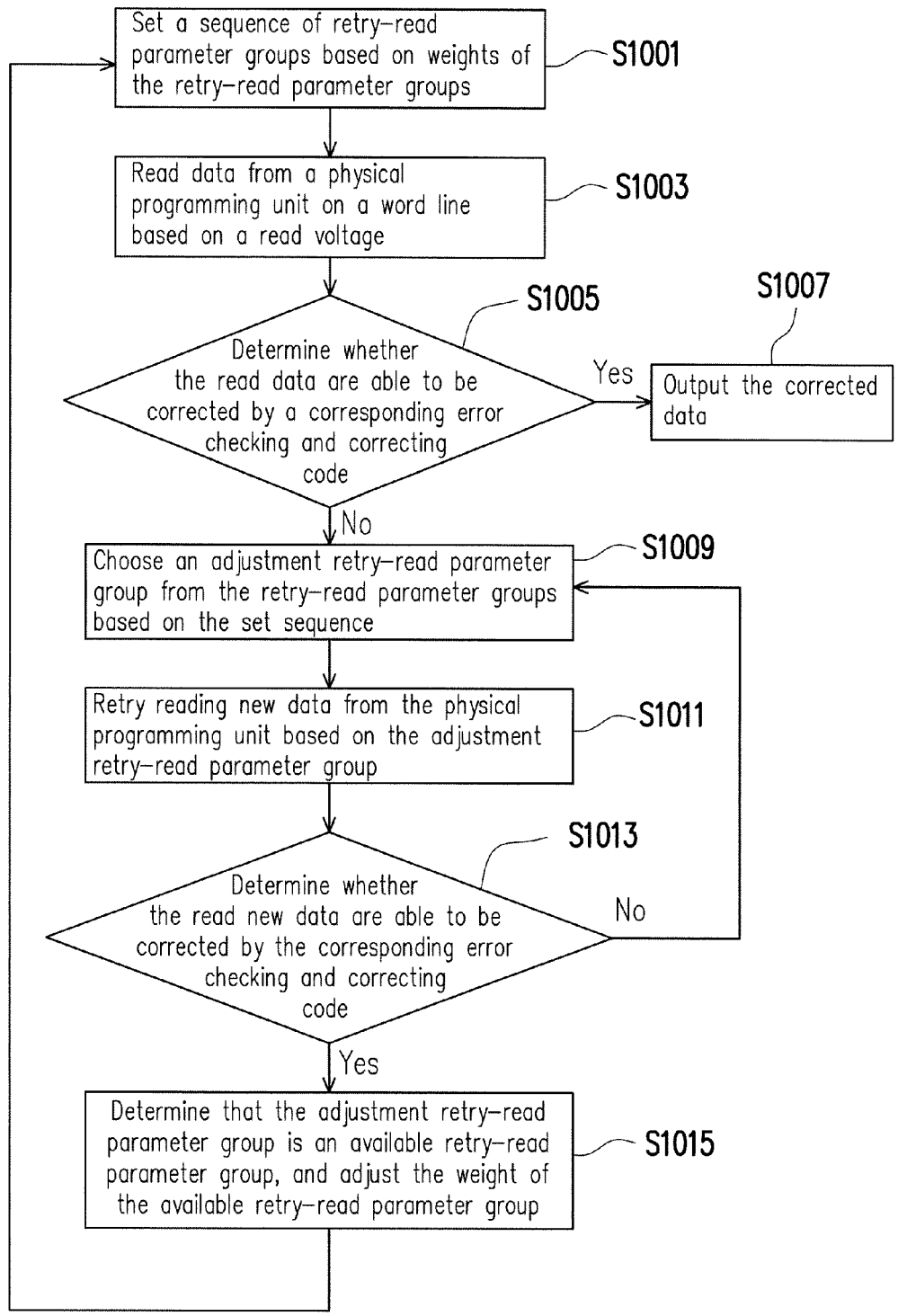
FIG. 10 is a schematic view illustrating a memory retry-read method according to an exemplary embodiment of the disclosure.

FIG. 10 is a schematic view illustrating a memory retry-read method according to an exemplary embodiment of the disclosure.

Referring to FIG. 10, at Step S1001, the MMC 502 may set a sequence of retry-read parameter groups based on weights of the retry-read parameter groups.

At Step S1003, the MMC 502 may send a read command sequence to instruct to read data from a PPU on a word line based on the read voltage. In an exemplary embodiment, the PPU may be the lower PPU or the upper PPU of the MLC NAND flash memory. In another exemplary embodiment, the PPU may be the lower PPU, the middle PPU or the upper PPU of the TLC NAND flash memory.

At Step S1005, the MMC 502 may determine whether the read data are able to be corrected by a corresponding ECC code. For example, the corresponding ECC code is the ECC code generated by the ECC circuit 508 based on programmed data when the data are programmed to the PPU on the word line.

If the read data are able to be corrected by the corresponding ECC code, at Step S1007, the MMC 502 may output the corrected data.

If the read data are unable to be corrected by the corresponding ECC code, the MMC 502 may carry out Step S1009. At Step S1009, the MMC 502 may choose an adjustment retry-read parameter group from the retry-read parameter groups based on the set sequence. Then, at Step S1011, the MMC 502 may retry reading new data from the PPU based on the adjustment retry-read parameter group. In an exemplary embodiment, the MMC 502 may adjust the read voltage to a new read voltage based on the read voltage adjustment value of the adjustment retry-read parameter group, and read data from the PPU based on the new read voltage.

After reading the new data, at Step S1013, the MMC 502 may determine whether the read new data are able to be corrected by the corresponding ECC code.

If the read new data are unable to be corrected by the corresponding ECC code, the MMC 502 may carry out Step S1009 again to choose the adjustment retry-read parameter group again.

If the read new data are able to be corrected by the corresponding ECC code, at Step S1015, the MMC 502 may determine that the adjustment retry-read parameter group is the available retry-read parameter group, and adjust the weight of the available retry-read parameter group. In addition, the MMC 502 may output the corrected new data. Subsequently, the MMC 502 may carry out Step S1001 again to reset the sequence of the retry-read parameter groups based on the adjusted weight.

Figure 11:
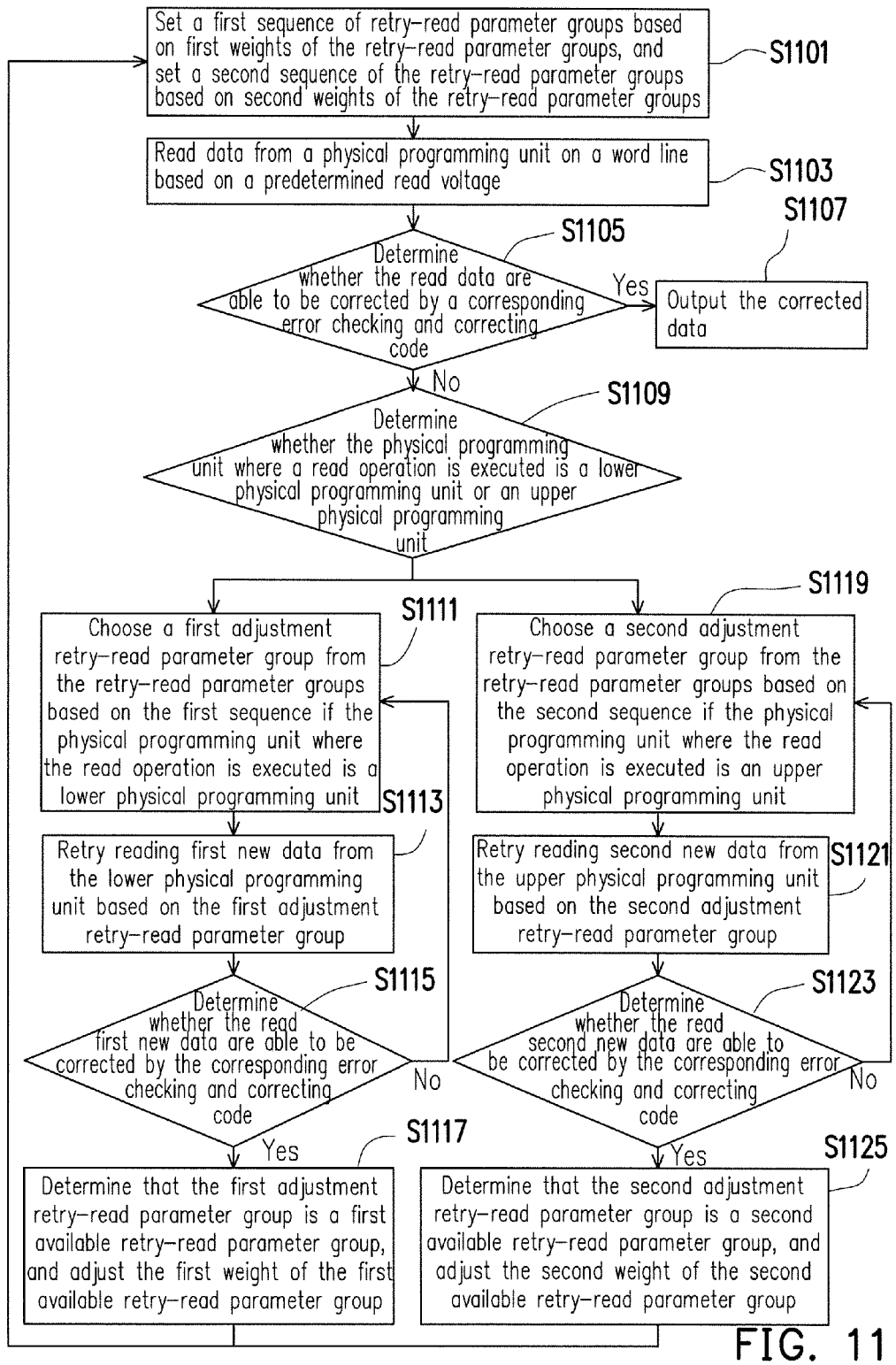
FIG. 11 is a schematic view illustrating a memory retry-read method according to another exemplary embodiment of the disclosure.

FIG. 11 is a schematic view illustrating a memory retry-read method according to another exemplary embodiment of the disclosure. What differs from the exemplary embodiment of FIG. 10 is that, in the exemplary embodiment of FIG. 11, each retry-read parameter group has two weights to respectively serve as basis for executing the lower PPU and the upper PPU of the MLC NAND flash memory.

Referring to FIG. 11, at Step S1101, the MMC 502 may set a first sequence of retry-read parameter groups based on first weights of the retry-read parameter groups, and set a second sequence of the retry-read parameter groups based on second weights of the retry-read parameter groups.

At Step S1103, the MMC 502 may send a read command sequence to instruct to read data from a PPU on a word line based on a predetermined read voltage. In the exemplary embodiment, the read PPU may be the lower PPU or the upper PPU of the MLC NAND flash memory. The predetermined read voltages for reading the lower PPU and the upper PPU may be at different read voltage levels.

At Step S1105, the MMC 502 may determine whether the read data are able to be corrected by a corresponding ECC code. For example, the corresponding ECC code is the ECC code generated by the ECC circuit 508 based on programmed data when the data are programmed to the PPU on the word line.

If the read data are able to be corrected by the corresponding ECC code, at Step S1107, the MMC 502 may output the corrected data.

If the read data are unable to be corrected by the corresponding ECC code, the MMC 502 may carry out Step S1109. At Step S1109, the MMC 502 determines whether the PPU where the read operation is to be executed is a lower PPU or an upper PPU.

At Step S1111, if the PPU where the read operation is to be executed is the lower PPU, the MMC 502 may choose a first adjustment retry-read parameter group from the retry-read parameter groups based on the first sequence. Then, at Step S1113, the MMC 502 may retry reading first new data from the lower PPU based on the first adjustment retry-read parameter group. In addition, at Step S1115, the MMC 502 may determine whether the read first new data are able to be corrected by the corresponding ECC code. If the read first new data are unable to be corrected by the corresponding ECC code, the MMC 502 may carry out Step S1111 again to choose the first adjustment retry-read parameter group again. If the read first new data are able to be corrected by the corresponding ECC code, at Step S1117, the MMC 502 may determine that the first adjustment retry-read parameter group is a first available retry-read parameter group, and adjust the first weight of the first available retry-read parameter group. Subsequently, the MMC 502 may carry out Step S1101 again to reset the first sequence of the retry-read parameter groups based on the adjusted first weight.

In addition, at Step S1119, if the PPU where the read operation is to be executed is an upper PPU, the MMC 502 may choose a second adjustment retry-read parameter group from the retry-read parameter groups based on the second sequence. Then, at Step S1121, the MMC 502 may read second new data from the upper PPU based on the second adjustment retry-read parameter group. In addition, at Step S1123, the MMC 502 may determine whether the read second new data are able to be corrected by the corresponding ECC code. If the read second new data are unable to be corrected by the corresponding ECC code, the MMC 502 may carry out Step S1119 again to choose the second adjustment retry-read parameter group again. If the read second new data are able to be corrected by the corresponding ECC code, at Step S1125, the MMC 502 may determine that the second adjustment retry-read parameter group is an second available retry-read parameter group, and adjust the second weight of the second available retry-read parameter group. Subsequently, the MMC 502 may carry out Step S1101 again to reset the second sequence of the retry-read parameter groups based on the adjusted second weight.

In view of the foregoing, according to the disclosure, the sequence of the retry-read parameter groups in the disclosure is able to be reset by adjusting the weight of the retry-read parameter group. Thus, the available retry-read parameter group determined in a retry-read operation executed on a PPU may be prioritized as the adjustment retry-read parameter group in the next retry-read operation on another PPU. Also, by setting different weights in the disclosure, the adjustment retry-read parameter group may be chosen from various corresponding sequences of the weights based on whether the PPU where the read operation is executed is the lower PPU, the middle PPU, or the upper PPU, so as to determine the available retry-read parameter group. Accordingly, the time for determining the retry-read parameter group may be reduced, so as to effectively reduce the time for executing the retry-read operation.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A memory retry-read method for a rewritable non-volatile memory module comprising a plurality of word lines, the memory retry-read method comprising:
    setting a first sequence of a plurality of retry-read parameter groups based on a plurality of first weights of the retry-read parameter groups, wherein each of the retry-read parameter groups corresponds to one of the first weights;
    reading first data from a first physical programming unit on a first word line of the word lines based on a first read voltage;
    choosing a first adjustment retry-read parameter group from the retry-read parameter groups based on the first sequence if the first data are unable to be corrected by a first corresponding error checking and correcting code;

retrying reading first new data from the first physical programming unit based on the first adjustment retry-read parameter group;

determining that the first adjustment retry-read parameter group is a first available retry-read parameter group if the first new data are able to be corrected by the first corresponding error checking and correcting code; and adjusting the first weight of the first available retry-read parameter group.

2. The memory retry-read method as claimed in claim 1, further comprising:

choosing the first adjustment retry-read parameter group from the retry-read parameter groups again based on the first sequence if the first new data are unable to be corrected by the first corresponding error checking and correcting code.

3. The memory retry-read method as claimed in claim 1, wherein the first adjustment retry-read parameter group comprises at least one read voltage adjustment value, wherein the step of retrying reading the first new data from the first physical programming unit based on the first adjustment retry-read parameter group comprises:

adjusting the first read voltage to a new read voltage based on the at least one read voltage adjustment value of the first adjustment retry-read parameter group; and retrying reading the first new data from the first physical programming unit based on the new read voltage.

4. The memory retry-read method as claimed in claim 1, wherein the first adjustment retry-read parameter group comprises a read speed adjustment value, wherein the step of retrying reading the first new data from the first physical programming unit based on the first adjustment retry-read parameter group comprises:

adjusting a clock frequency based on the read speed adjustment value of the first adjustment retry-read parameter group; and reading the first new data from the first physical programming unit based on the adjusted clock frequency.

5. The memory retry-read method as claimed in claim 1, wherein the step of adjusting the first weight of the first available retry-read parameter group comprises:

adjusting the first weight of the first available retry-read parameter group from a lower weight value to a higher weight value.

6. The memory retry-read method as claimed in claim 1, further comprising:

recording a first number of times of successful retry-reading of the first available retry-read parameter group, wherein the step of adjusting the first weight of the first available retry-read parameter group comprises:

adjusting the first weight of the first available retry-read parameter group based on the first number of times of successful retry-reading of the first available retry-read parameter group.

7. The memory retry-read method as claimed in claim 1, further comprising:

recording the first available retry-read parameter group as a recently used retry-read parameter group, wherein the step of adjusting the first weight of the first available retry-read parameter group comprises:

adjusting the first weight of the first available retry-read parameter group to a highest weight value based on the recently used retry-read parameter group.

8. The memory retry-read method as claimed in claim 1, further comprising:

setting a second sequence of the retry-read parameter groups based on a plurality of second weights of the retry-read parameter groups, wherein each of the retry-read parameter groups corresponds to one of the second weights;

reading second data from a second physical programming unit on the first word line based on a second read voltage;

choosing a second adjustment retry-read parameter group from the retry-read parameter groups based on the second sequence if the second data are unable to be corrected by a second corresponding error checking and correcting code;

retry reading second new data from the second physical programming unit based on the second adjustment retry-read parameter group;

determining that the second adjustment retry-read parameter group is a second available retry-read parameter group if the second new data are able to be corrected by the second corresponding error checking and correcting code; and adjusting the second weight of the second available retry-read parameter group.

9. The memory retry-read method as claimed in claim 8, wherein the first sequence is different from the second sequence.

10. The memory retry-read method as claimed in claim 8, wherein the first physical programming unit is a lower physical programming unit, and the second physical programming unit is an upper physical programming unit.

11. The memory retry-read method as claimed in claim 1, further comprising:

adjusting the first weights of rest of the retry-read parameter groups other than the first available retry-read parameter group based on the adjusted first weight of the first available retry-read parameter group; and storing the adjusted first weights of the retry-read parameter groups to the rewritable non-volatile memory module.

12. A memory control circuit unit for controlling a rewritable non-volatile memory module comprising a plurality of word lines, the memory control circuit unit comprising:

a host interface, configured to be coupled to a host system;

a memory interface, configured to be coupled to the rewritable non-volatile memory module; and a memory management circuit, coupled to the host interface and the memory interface, wherein the memory management circuit is configured to set a first sequence of a plurality of retry-read parameter groups based on a plurality of first weights of the retry-read parameter groups, wherein each of the retry-read parameter groups corresponds to one of the first weights, wherein the memory management circuit is configured to send a read command sequence to instruct to read first data from a first physical programming unit on a first word line of the word lines based on a first read voltage, wherein the memory management circuit is configured to choose a first adjustment retry-read parameter group from the retry-read parameter groups based on the first sequence if the first data are unable to be corrected by a first corresponding error checking and correcting code, wherein the memory management circuit is configured to retry reading first new data from the first physical programming unit based on the first adjustment retry-read parameter group, wherein the memory management circuit s configured to determine that the first adjustment retry-read parameter group is a first available retry-read parameter group if the first new data are able to be corrected by the first corresponding error checking and correcting code, and wherein the memory management circuit is configured to adjust the first weight of the first available retry-read parameter group.

13. The memory control circuit unit as claimed in claim 12, wherein the memory management circuit is configured to choose the first adjustment retry-read parameter group from the retry-read parameter groups again based on the first sequence if the first new data are unable to be corrected by the first corresponding error checking and correcting code.

14. The memory control circuit unit as claimed in claim 12, wherein the first adjustment retry-read parameter group comprises at least one read voltage adjustment value, and the memory management circuit is configured to adjust the first read voltage to a new read voltage based on the at least one read voltage adjustment value of the first adjustment retry-read parameter group and send another read command sequence to instruct to retry reading the first new data from the first physical programming unit based on the new read voltage.

15. The memory control circuit unit as claimed in claim 12, wherein the memory management circuit is configured to adjust the first weight of the first available retry-read parameter group from a lower weight value to a higher weight value.

16. The memory control circuit unit as claimed in claim 12, wherein the memory management circuit is configured to record a first number of times of successful retry-reading of the first available retry-read parameter group and adjust the first weight of the first available retry-read parameter group based on the first number of times of successful retry-reading.

17. The memory control circuit unit as claimed in claim 12, wherein the memory management circuit is configured to set a second sequence of the retry-read parameter groups based on a plurality of second weights of the retry-read parameter groups, wherein each of the retry-read parameter groups corresponds to one of the second weights, wherein the memory management circuit is configured to send another read command sequence to instruct to read second data from a second physical programming unit on the first word line based on a second read voltage, wherein the memory management circuit is configured to choose a second adjustment retry-read parameter group from the retry-read parameter groups based on the second sequence if the second data are unable to be corrected by a second corresponding error checking and correcting code, wherein the memory management circuit is configured to retry reading second new data from the second physical programming unit based on the second adjustment retry-read parameter group, wherein the memory management circuit is configured to determine that the second adjustment retry-read parameter group is a second available retry-read parameter group if the second new data are able to be corrected by the second corresponding error checking and correcting code, and wherein the memory management circuit is configured to adjust the second weight of the second available retry-read parameter group.

18. The memory control circuit unit as claimed in claim 17, wherein the first sequence is different from the second sequence.

19. A memory storage device, comprising:
a connection interface unit, coupled to a host system;
a rewritable non-volatile memory module, comprising a plurality of word lines;
a memory control circuit unit, coupled to the connection interface unit and the rewritable non-volatile memory module, wherein the memory control circuit unit is configured to set a first sequence of a plurality of retry-read parameter groups based on a plurality of first weights of the retry-read parameter groups, wherein each of the retry-read parameter groups corresponds to one of the first weights, wherein the memory control circuit unit is configured to send a read command sequence to instruct to read first data from a first physical programming unit on a first word line of the word lines based on a first read voltage, wherein the memory control circuit unit is configured to choose a first adjustment retry-read parameter group from the retry-read parameter groups based on the first sequence if the first data are unable to be corrected by a first corresponding error checking and correcting code, wherein the memory control circuit unit is configured to retry reading first new data from the first physical programming unit based on the first adjustment retry-read parameter group, wherein the memory control circuit unit is configured to determine that the first adjustment retry-read parameter group is a first available retry-read parameter group if the first new data are able to be corrected by the first corresponding error checking and correcting code, and wherein the memory control circuit unit is configured to adjust the first weight of the first available retry-read parameter group.

20. The memory storage device as claimed in claim 19, wherein the memory control circuit unit is configured to choose the first adjustment retry-read parameter group from the retry-read parameter groups again based on the first sequence if the first new data are unable to be corrected by the first corresponding error checking and correcting code.

21. The memory storage device as claimed in claim 19, wherein the first adjustment retry-read parameter group comprises at least one read voltage adjustment value, and the memory control circuit unit is configured to adjust the first read voltage to a new read voltage based on the at least one read voltage adjustment value of the first adjustment retry-read parameter group and send another read command sequence to instruct to retry reading the first new data from the first physical programming unit based on the new read voltage.

22. The memory storage device as claimed in claim 19, wherein the memory control circuit unit is configured to adjust the first weight of the first available retry-read parameter group from a lower weight value to a higher weight value.

23. The memory storage device as claimed in claim 19, wherein the memory control circuit unit is configured to record a first number of times of successful retry-reading of the first available retry-read parameter group and adjust the first weight of the first available retry-read parameter group based on the first number of times of successful retry-reading.

24. The memory storage device as claimed in claim 19, wherein the memory control circuit unit is configured to set a second sequence of the retry-read parameter groups based on a plurality of second weights of the retry-read parameter groups, wherein each of the retry-read parameter groups corresponds to one of the second weights,
  wherein the memory control circuit unit is configured to send another read command sequence to instruct to read second data from a second physical programming unit on the first word line based on a second read voltage,
  wherein the memory control circuit unit is configured to choose a second adjustment retry-read parameter group from the retry-read parameter groups based on the second sequence if the second data are unable to be corrected by a second corresponding error checking and correcting code,
  wherein the memory control circuit unit is configured to retry reading second new data from the second physical programming unit based on the second adjustment retry-read parameter group,
  wherein the memory control circuit unit is configured to determine that the second adjustment retry-read parameter group is a second available retry-read parameter group if the second new data are able to be corrected by the second corresponding error checking and correcting code, and
  wherein the memory control circuit unit is configured to adjust the second weight of the second available retry-read parameter group.

* * * * *